United States Patent [19]

Taylor

[11] Patent Number: 4,774,497
[45] Date of Patent: Sep. 27, 1988

[54] DIGITAL-TO-ANALOG CONVERTER WITH GAIN COMPENSATION

[75] Inventor: Stewart S. Taylor, Beaverton, Oreg.

[73] Assignee: Tektronix, Inc., Beaverton, Oreg.

[21] Appl. No.: 884,120

[22] Filed: Jul. 10, 1986

[51] Int. Cl.$^4$ ............................................... H03M 1/80
[52] U.S. Cl. ..................................... 341/118; 330/279; 341/133; 341/144
[58] Field of Search ................. 340/347 DA, 347 CC, 340/347 AD, 347 M; 330/279

[56] References Cited

U.S. PATENT DOCUMENTS 3,940,760  2/1976  Brokaw ..................... 340/347 M X
4,092,639  5/1978  Schoeff ....................... 340/347 DA Primary Examiner—T. J. Sloyan
Attorney, Agent, or Firm—William S. Lovell; Paul S. Angello

[57] ABSTRACT

A digital-to-analog converter circuit (10) comprises a current switch (22) that has differential input conductors (16a, 16b, ..., 16n and 18a, 18b, ..., 18n) which receive complementary logic voltage signals corresponding to a digital input word ($X_1, X_2, ..., X_n$). The current switch synthesizes an output signal ($V_o - \overline{V}_o$) whose magnitude corresponds to the weighted value of the digital input word. The circuit further comprises a current reference source (60) that develops a reference current ($I_{REF}$) from which transistor constant-current sources (48a, 48b, ..., 48n) in the current switch derive binary-weighted currents to synthesize the output voltage signal. The current reference source includes an impedance element or resistor (70) through which the reference current flows and which is scaled to the load impedance connected to the current switch. The impedance element compensates for digital-to-analog converter gain dependence associated with the effect of the Early voltage and $\beta$ on the output impedance of the transistors forming the current switch. The presence of the impedance element promotes, therefore, stable, uniform changes in the magnitude of the output voltage signal in response to incremental changes in the weighted value of the digital input word.

3 Claims, 1 Drawing Sheet

DIGITAL-TO-ANALOG CONVERTER WITH GAIN COMPENSATION

BACKGROUND OF THE INVENTION

The present invention relates to digital-to-analog converters and, in particular, to a high-speed digital-to-analog converter with gain compensation that provides an output signal which corresponds with high precision to the weighted value of a digital input word.

A digital-to-analog converter is typically fabricated as an integrated circuit. One type of digital-to-analog converter comprises an electrical current switch that includes an array of differential amplifiers formed from, for example, bipolar or MOS transistors. Each differential amplifier has one or more input conductors that receive voltage signals which correspond to one bit of a digital input word. Each differential amplifier operates as a switch element that conducts electrical current of a magnitude that corresponds to the binary-weighted value of the signal applied to its input. The character of the analog output signal depends on whether the digital-to-analog converter operates in a single-ended or differential output mode.

In the single-ended output mode, the output conductor of each differential amplifier is connected to a common load resistor. Whenever voltage signals corresponding to a logic 1 are applied to its input conductors, the differential amplifier provides to its output conductor current flow of an amount that corresponds to the binary-weighted value of the input bit. Whenever voltage signals corresponding to a logic 0 are applied to its input conductors, the differential amplifier provides no current flow to its output conductor. The binary-weighted currents flow from the common load resistor into the outputs of the differential amplifiers and thereby cause a voltage corresponding to the weighted value of the input digital word to develop across it.

In the differential output mode, each differential amplifier has first and second output conductors which are supplementary in that the binary-weighted current flows through only one of them at a given time. The first and second output conductors of the differential amplifiers are connected to, respectively, first and second common load resistors. Whenever voltage signals corresponding to a logic 1 are applied to its input conductors, the differential amplifier provides to its first output conductor current flow of an amount that corresponds to the binary-weighted value of the input bit. Whenever voltage signals corresponding to a logic 0 are applied to its input conductors, the differential amplifier provides to its second output conductor current flow of an amount that corresponds to the binary-weighted value of the input bit. The binary-weighted currents flowing through the first and second common load resistors flow into the respective first and second outputs of the differential amplifiers and thereby cause a differential voltage corresponding to the weighted value of the input digital word to develop across them. Operation in the differential mode effectively doubles the peak-to-peak output current and voltage swing of the digital-to-analog converter.

A controlled constant-current source develops the appropriate binary-weighted current that flows through the differential amplifier to which the output of the constant-current source is connected. Each constant-current source derives its binary-weighted current from a current reference source that provides a reference current of fixed amount.

An ideal digital-to-analog converter provides an output signal of either current or voltage which undergoes linear changes in its magnitude in response to incremental changes in the weighted value of the digital input word. The problem with high-speed digital-to-analog converters is that they employ high-speed semiconductor switching devices which function in a nonlinear manner and, therefore, cause a departure from this ideal condition. The result is nonuniform changes in magnitude of the output current or voltage in response to incremental changes in the digital input word.

SUMMARY OF THE INVENTION

An object of the present invention is, therefore, to provide a high-speed digital-to-analog converter that develops an output signal which corresponds with high precision to the weighted value of a digital input word.

Another object of the invention is to provide in such a digital-to-analog converter high-speed semiconductor switching devices that are suitable for fabrication as part of an integrated circuit.

A further object of this invention is to provide such a digital-to-analog converter that uses controlled constant-current sources in association with transistor differential amplifiers to develop and select binary-weighted currents of the required amounts and combine them to synthesize an output signal corresponding to the weighted value of a digital input word.

The present invention is a digital-to-analog converter circuit that comprises a current switch which has plural input conductors that receive voltage signals corresponding to the logic states of the bits of a digital input word. The current switch synthesizes an output voltage signal whose magnitude corresponds to the weighted value of the digital input word. In a preferred embodiment, the current switch employs plural differential amplifiers, each including a pair of emitter-coupled bipolar transistors that are electrically connected to a transistor constant-current source.

The circuit further comprises a current reference source that develops a reference current from which the constant-current sources in the current switch derive binary-weighted currents to synthesize the output voltage signal. The current reference source includes an impedance element or resistor through which the reference current flows and whose value is scaled to that of a load impedance connected to the current switch and to the full scale current flowing through the load impedance. The presence of the impedance element promotes stable, uniform changes in magnitude of the output voltage signal in response to incremental changes in the weighted value of the digital input word.

The impedance element compensates for the digital-to-analog converter gain dependence associated with the output impedance of the transistors forming the differential amplifier. The output impedance of a bipolar transistor having a constant emitter current is a function of the common emitter current gain "$\beta$" and of the Early voltage "$V_A$." The value of $\beta$ varies appreciably with changes in temperature and differs with each circuit. The Early voltage is an inverse function of the ratio of a change in the collector current ($\Delta I_c$) to a change in the collector-to-emitter voltage ($\Delta V_{CE}$) for a particular base current. The Early voltage of high-speed transistors is very low (i.e., $\Delta I_C/\Delta V_{CE}$ is relatively large), is temperature dependent to some extent, and differs for each circuit. It has been found that the Early voltage adversely impacts the gain of the digital-to-analog converter circuit and the linearity of the single-ended output voltage as a function of the weighted value of the digital input word.

In a preferred embodiment, each differential amplifier has first and second supplementary collector outputs that are connected to respective first and second load resistors across which a differential output voltage appears. The binary-weighted current flowing through each differential amplifier flows through only one of its two collector outputs. The impedance element is connected in series with a transistor of the same operating characteristics and design as those of the emitter-coupled transistors in each differential amplifier. Since only one transistor is always conducting the binary-weighted current during any particular time, the impedance element and the transistor in the current reference source together compensate for and track changes in the output impedance stemming from the Early voltage. An impedance element of the proper value stabilizes, therefore, the digital-to-analog converter gain. This technique for eliminating gain dependence as a function of output impedance is also applicable to other device technologies such as NMOS, CMOS, JFETS, and GaAs MESFETS.

Additional objects and advantages of the present invention will be apparent from the following detailed description of a preferred embodiment thereof, which proceeds with reference to the accompanying drawings.

DETAILED DESCRIPTION OF PREFERRED EMBODIMENT

Figures 1, 2:
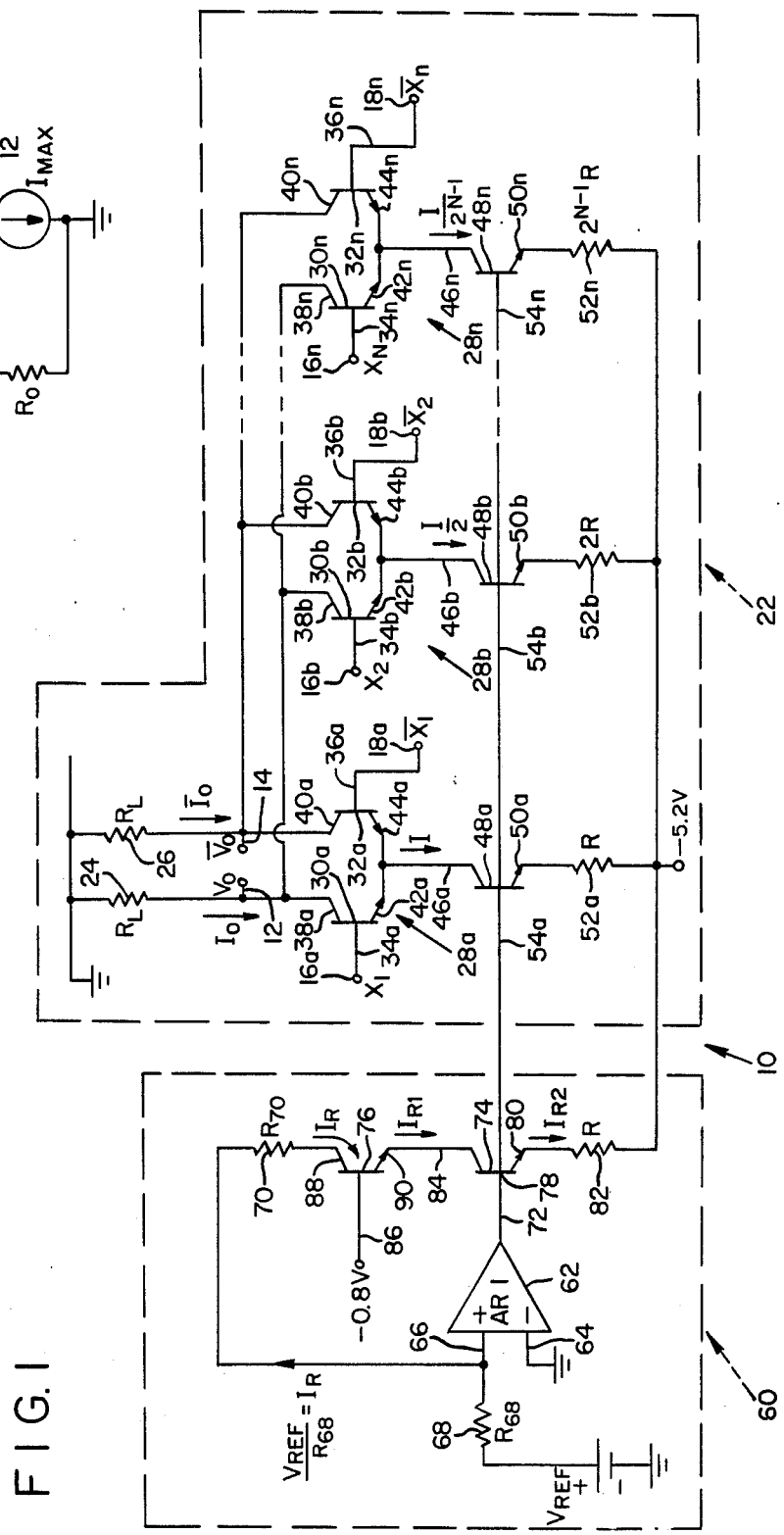
FIG. 1 is an electrical circuit schematic diagram of the digital-to-analog converter of the present invention.
FIG. 2 is an electrical circuit schematic diagram representing the equivalent circuit of the current switch of the circuit of FIG. 1 whenever voltage signals representing a digital input word of maximum weighted value are applied to its input conductors.

With reference to FIG. 1, the digital-to-analog converter 10 of the present invention provides across its output conductors 12 and 14 a differential output voltage $V_0 - \overline{V}_0$ that corresponds to the weighted value of a digital input word having N number of parallel bits $x_1$, $x_2, \ldots, x_N$. Each bit of the digital input word is represented by complementary logic voltage signals that are applied to one of the N number of input conductors 16a, 16b, ..., 16n and to one of the N number of input conductors 18a, 18b, ..., 18n.

Circuit 10 includes a current switch 22 that comprises N number of differential amplifiers, each differential amplifier comprising a pair of emitter-coupled NPN transistors and a NPN transistor constant-current source. Each differential amplifier receives at its input conductors complementary logic voltage signals corresponding to one bit of the digital input word and develops a binary-weighted current that corresponds to the weighted value of the bit in the digital word. The binary-weighted currents developed by the differential amplifiers flow through either one of two load impedances or resistors 24 and 26 and develop the respective output voltages $V_0$ and $\overline{V}_0$. The total current flowing through resistor 24 is identified as $I_0$, and the total current flowing through resistor 26 is identified as $\overline{I}_0$.

FIG. 1 shows three of the N number of differential amplifiers 28a, 28b, ..., 28n, which are of similar design and whose corresponding components have identical reference numerals with a different lower case letter suffix. Each such suffix represents a particular differential amplifier and, therefore, identifies a component that comprises a part of it. Although it is directed specifically to differential amplifier 28a, which receives at its input conductors 16a and 18a voltage signals corresponding to the most significant bit $x_1$, the following description similarly applies to each of the N number of differential amplifiers in current switch 22.

Differential amplifier 28a includes a pair of emitter-coupled transistors 30a and 32a. The base terminal 34a of transistor 30a and the base terminal 36a of transistor 32a receive a logic voltage signal and a complementary logic voltage signal, respectively, corresponding to the most significant bit $x_1$. In emitter-coupled logic (ECL) circuitry, for example, $-0.8$ volt corresponds to a logic 1 and $-1.7$ volts corresponds to a logic 0. Under these conditions, the logic 1 voltage signal biases one of the transistors 30a and 32a in the forward active region. The collector terminal 38a of transistor 30a is connected to load resistor 24, which is connected to ground potential; and the collector terminal 40a of transistor 32a is connected to load resistor 26, which is connected to ground potential. The emitter terminals 42a and 44a of the respective transistors 30a and 32a are both connected to the collector terminal 46a of a constant-current source transistor 48a. The emitter terminal 50a of transistor 48a is connected to a resistor 52a of value "R," which is connected to $-5.2$ volts. The base terminal 54a of transistor 48a has a fixed voltage applied to it, which voltage is derived in a manner described below, to promote constant-current source operation. The differential amplifier 28a operates in the following manner.

Whenever a logic 1 voltage signal (i.e., $-0.8$ volt) and a logic 0 voltage signal (i.e., $-1.7$ volts) are applied to input conductors 16a and 18a, respectively, transistor 30a is biased in the forward active region, and a current "I" developed by constant-current source transistor 48a flows from collector terminal 38a to emitter terminal 42a of transistor 30a. During this time, transistor 32a is biased in the cutoff region. The current "I" flows through resistor 24, but no current developed by differential amplifier 28a flows through resistor 26.

Whenever a logic 0 voltage signal and a logic 1 voltage signal are applied to input conductors 16a and 18a, respectively, transistor 32a is biased in the forward active region, and a current "I" developed by constant-current source transistor 48a flows from collector terminal 40a to emitter terminal 44a of transistor 32a. During this time, transistor 30a is biased in the cutoff region. The current "I" flows through load resistor 26, but no current developed by differential amplifier 28a flows through load resistor 24. The magnitude of the current "I" is set by the value of "R" that is assigned to resistor 52. The current "I" corresponds to the weighted value of the most significant bit of the digital input word. The above description disregards the diminution in current caused by the $\alpha$ parameters of transistors 30a, 32a, and 48a.

The differences among the differential amplifiers lie in the values of the resistors 52a, 52b, ..., 52n that are connected between the $-5.2$ volt power supply and the emitter terminals of the constant-current source transistors. The value of each of these resistors is set by the binary-weighted value of the current that is to be delivered to either one of the load resistors 24 and 26. Resistor 52b is assigned a value "2R" which provides a binary-weighted current of magnitude "I/2," which corresponds to the weighted value of the second-most significant bit. Resistor 52n is assigned a value "$2^{n-1}R$" which provides a binary-weighted current of magnitude $I/2^{n-1}$, which corresponds to the weighted value of the least significant bit. It will be appreciated that the emitter voltages of the constant-current source transistors 48a, 48b, . . . , 48n are equal. This is accomplished by binary scaling of the emitter areas of transistors 48a, 48b, . . . , 48n, with the emitter of transistor 48a having the largest area.

As shown in FIG. 1, the collector terminals 38a, 38b, . . . , 38n of the respective transistors 30a, 30b, . . . , 30n whose base terminals receive the logic 1 voltage signals corresponding to the bits of the digital input word are connected to output conductor 12 and cause a current $I_0$ to flow through load resistor 24. Similarly, the collector terminals 40a, 40b, . . . , 40n of the respective transistors 32a, 32b, . . . , 32n whose base terminals receive the logic 1 voltage signals corresponding to the bits of the digital input word are connected to output conductor 14 and cause a current $\bar{I}_0$ to flow through load resistor 26. It will be appreciated that the currents $I_0$ and $\bar{I}_0$ are supplementary in that their maximum values occur whenever the digital input word has a maximum weighted value and a minimum weighted value, respectively. The voltage appearing across output conductors 12 and 14 is nearly zero whenever $I_0 \approx \bar{I}_0$, i.e., at the midrange weighted value of the digital input word. ($I_0$ and $\bar{I}_0$ differ by an amount of current corresponding to one least significant bit under this input condition.)

Digital-to-analog converter 10 also includes a current reference source or means 60 which provides a reference current of fixed value from which the constant-current source transistors 48a, 48b, . . . , 48n in current switch 22 derive the binary-weighted currents to synthesize the differential output voltage signal. Current reference source 60 comprises an operational amplifier 62 whose inverting input 64 is connected to ground potential and whose noninverting input 66 is connected to the junction node between a reference current $I_R$ and an impedance element or resistor 70. Resistor 68 is connected in series with a positive DC bias voltage "$V_{REF}$" which develops the reference current $I_R = V_{REF}/R_{68}$, where $R_{68}$ equals the value of resistor 68. Since operational amplifier 62 has effectively an infinite open loop gain, its noninverting input 66 is at a virtual ground potential. None of the current "$I_R$" flows into operational amplifier 62.

Inverting input 64 of operational amplifier 62 and one lead of each of the load resistors 24 and 26 are connected to a common potential, which in the preferred embodiment is ground. If the potential has a value other than ground, the value of $V_{REF}$ must be adjusted to maintain a reference current $I_R$ of the amount established at ground potential.

The output 72 of operational amplifier 62 is fed back to its noninverting input 66 in a closed loop path, which includes NPN transistors 74 and 76 and resistor 70. The current flowing through the feedback path is the reference current "$I_R$", which does not change, therefore, over a broad range of values of resistor 70. Transistors 74 and 76 and resistor 70 appear in the feedback loop around operational amplifier 62 for the following reasons.

Transistor 74 corresponds to each of the constant-current source transistors 48a, 48b, . . . , 48n of current switch 22. The voltage appearing at output 72 of operational amplifier 62 is applied to the base terminal 78 of transistor 74, as well as to the base terminals 54a, 54b, . . . , 54n of the respective constant-current source transistors 48a, 48b, . . . , 48n. The voltage appearing at the emitter terminal 80 of transistor 74 is set by the current "$I_R$" flowing through the resistor 82, which is connected between emitter 80 and the $-5.2$ volts bias voltage and is the same as that appearing at emitter terminals 50a, 50b, . . . , 50n of respective transistors 48a, 48b, . . . , 48n.

Transistor 76 corresponds to one of the emitter-coupled transistors of each of the differential amplifiers 28a, 28b, . . . , 28n. The logic 1 voltage ($-0.8$ volt) is applied to the base terminal 86 of transistor 76, which allows the reference current "$I_R$" to flow from its collector terminal 88 to its emitter terminal 90. The voltage applied to base terminal 86 of transistor 76 preferably is the same as the most positive voltage that is applied to the base terminals of transistors 30a and 32a, 30b and 32b, . . . , 30n and 32n. Since it is biased in the forward active region, transistor 76 corresponds particularly to the one emitter-coupled transistor of the pair respectively constituting differential amplifers 28a, 28b, . . . , 28n that is biased in the forward active region.

Resistor 70 corresponds to load resistors 24 and 26 presented at conductors 12 and 14 of circuit 10. The value of resistor 70 is chosen to compensate for the effect of the Early voltages of transistor 76 and the emitter-coupled transistors 30a, 30b, . . . , 30n and 32a, 32b, . . . , 32n. The value of resistor 70 is computed as described below with reference to FIG. 2.

FIG. 2 is an equivalent circuit of current switch 22 when a logic 1 voltage signal is applied to each one of its input conductors 16a, 16b, . . . , 16n and a logic 0 voltage signal is applied to each one of its input conductors 18a, 18b, . . . , 18n. This condition causes maximum current flow through load resistor 24 and no current flow through load resistor 26. The voltage $V_0$ across load resistor 24 is at its maximum value, and the voltage $\bar{V}_0$ across load resistor 26 is zero. Similarly, the current $I_0$ is at its maximum value, and the current $\bar{I}_0$ is zero.

With reference to FIG. 2, under the input conditions described above, the current flowing into output conductor 12 can be modeled as originating from a constant-current source of magnitude $I_{MAX}$ with parallel impedances $R_0$ and $R_L$, where $R_0$ represents the equivalent output impedance presented by the differential amplifiers 28a, 28b, . . . , 28n and $R_L$ represents the value of load resistor 24. The presence of $R_0$ is a consequence of the Early voltage and causes the value of $V_0$ to be smaller than it would be if there were no Early voltage effect. The Early voltage of transistor 76 causes the value of $I_{MAX}$ to be greater than it otherwise would be. When the current $I_0$ equals its maximum value, $I_{MAX}$, the voltage, $V_0$, can be expressed as:

$$V_0 = (I_0 + \bar{I}_0) \times (R_L \times R_0)/(R_L + R_0) \approx I_{MAX} \times R_L.$$

The objective is to make, under the input conditions described above, the voltage across resistor 70 equal to the voltage across resistor 24 and the voltage at collector 88 of transistor 76 equal to the voltage at collector 38a of transistor 30a. The voltage across resistor 70 is $I_R \times R_{70}$, where $R_{70}$ is the value of resistor 70 and can be computed as $$R_{70} = I_{MAX} \times R_L / I_R.$$

The collector-to-emitter voltages of transistor 76 and transistors 30a, 30b, ..., 30n are the same for the computed value of resistor 70. It has been verified that the above-computed value for resistor 70 provides the desired compensation for the Early voltage when a differential voltage, i.e., ($V_0 - \overline{V}_0$) is taken for all possible weighted values of the digital input word. Typical exemplary values for $R_L$, $I_{MAX}$, and $I_{REF}$ would be 50 ohms, $10 \times (1 - 2^{1-N})$ milliamperes, and 5 milliamperes, respectively. Resistor 70 would have, therefore, a value $R_{70} = 100$ ohms.

It will be appreciated that the voltages across corresponding components in current switch 22 and current reference source 60 are equal. This eliminates the gain dependence of digital-to-analog converter 10 as a function of the transistor output impedance. The binary-weighted currents developed by the constant-current sources in switching circuit 22 are derived from the reference current and, therefore, change uniformly in response to, for example, changes in "$I_{R1}$" and "$I_{R2}$" that result from changes in the $\alpha$ parameters of transistors 74 and 76. (The current "$I_{R1}$," which flows through emitter 90 of transistor 76, equals $I_R / \alpha$; and the current "$I_{R2}$," which flows through emitter 80 of transistor 74, equals $I_R / \alpha^2$.)

It will be obvious to those having skill in the art that many changes may be made in the above-described details of the preferred embodiment of the present invention without departing from the underlying principles thereof. For example, the output of digital-to-analog converter 10 could be operated in the single-ended mode. Such operation would degrade somewhat the accuracy of the output signal with respect to the weighted value of the digital input word to which it corresponds. Moreover, the binary-weighted currents could be derived in accordance with other prior art techniques, such as, for example, a R-2R ladder. The current sources could also be implemented with an array of sequentially switched identical current sources and associated decoding circuitry positioned ahead of them. This is sometimes referred to as a "segmented DAC." Finally, the disclosed technique is applicable to semiconductor devices other than bipolar transistors.

The scope of the present invention should be determined, therefore, only by the following claims.

I claim:

1. A digital-to-analog converter circuit, comprising:
a current switch including a plurality of differential amplifies, each differential amplifier including a pair of emitter-coupled NPN transistors, a binary-weighted NPN transistor constant-current source including a current source transistor having a base terminal and a binary-weighted emitter resistor, an input for receiving a complementary logic input voltage signal and an output for developing a binary-weighted output current corresponding to the complementary logic input voltage signal, wherein the maximum output current has a value of $I_{MAX}$;
a pair of load impedances each having a value of $R_L$ for receiving the total binary-weighted output current and for developing a complementary output voltage; and
a current reference source including a source of constant reference current having a value of $I_R$, an operational amplifier having a positive input, a negative input, and an output, the positive input being coupled to the source of constant reference current, the negative input being coupled to ground, a first transistor having a base, a collector, and an emitter, the collector being coupled to the positive input through an impedance element having a value of $R_L I_{MAX} / I_R$, the base being coupled to a reference voltage, and a second transistor having a base, a collector, and an emitter, the collector being coupled to the emitter of the first transistor, the emitter being coupled to a supply voltage, and the base being coupled to the output of the operational amplifier and to the base terminal of each of the current source transistors,
the value of the impedance element being selected to compensate for the effect of the Early voltages of the emitter-coupled NPN transistors, thereby substantially eliminating the sensitivity of the output current and corresponding output voltage to fluctuations in Early voltage.

2. A circuit as in claim 1 wherein the value of the reference voltage coupled to the base of the first transistor is substantially equal to a logic 1 voltage level.

3. A circuit as in claim 1 wherein the emitter areas of the current source transistors are binarily scaled such that the emitter voltage of each transistor is equal.

* * * * *